(12) United States Patent
Nagai et al.

(10) Patent No.: US 7,875,419 B2
(45) Date of Patent: Jan. 25, 2011

(54) METHOD FOR REMOVING RESIST PATTERN AND METHOD FOR MANUFACTURING SEMICONDUCTOR DEVICE

(75) Inventors: Masaharu Nagai, Kanagawa (JP);
Kiyofumi Ogino, Kanagawa (JP);
Teruhisa Nakai, Tochigi (JP); Eiji Shioda, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 176 days.

(21) Appl. No.: 10/694,986

(22) Filed: Oct. 29, 2003

(65) Prior Publication Data
US 2004/0091820 A1 May 13, 2004

(30) Foreign Application Priority Data
Oct. 29, 2002  (JP)  ............................. 2002-314894

(51) Int. Cl.
*G03F 7/42* (2006.01)
*H01L 21/027* (2006.01)

(52) U.S. Cl. .................. 430/329; 430/318; 430/328; 430/326; 430/313; 430/165

(58) Field of Classification Search ............. None
See application file for complete search history.

(56) References Cited

U.S. PATENT DOCUMENTS

| 4,646,424 | A | * | 3/1987 | Parks et al. ............ 438/158 |
| 4,673,808 | A | * | 6/1987 | Katohno et al. .......... 359/235 |
| 4,692,205 | A | | 9/1987 | Sachdev et al. |
| 4,745,042 | A | | 5/1988 | Sasago et al. |
| 4,816,115 | A | * | 3/1989 | Horner et al. ........... 438/623 |
| 5,129,991 | A | | 7/1992 | Gilton |
| 5,252,427 | A | * | 10/1993 | Bauer et al. ........... 430/270.1 |
| 5,506,168 | A | | 4/1996 | Morita et al. |
| 6,009,888 | A | * | 1/2000 | Ye et al. .................. 134/1.3 |
| 6,057,081 | A | | 5/2000 | Yunogami et al. |
| 6,207,247 | B1 | | 3/2001 | Morita |
| 6,285,433 | B1 | | 9/2001 | Kawasaki |
| 6,423,477 | B1 | | 7/2002 | Engelen et al. |
| 6,432,620 | B1 | | 8/2002 | Arao |
| 6,497,992 | B1 | | 12/2002 | Yunogami et al. |
| 6,524,936 | B2 | | 2/2003 | Hallock et al. |
| 6,645,851 | B1 | * | 11/2003 | Ho et al. .................. 438/626 |
| 6,734,120 | B1 | | 5/2004 | Berry et al. |
| 6,746,965 | B2 | | 6/2004 | Uehara et al. |
| 7,344,825 | B2 | | 3/2008 | Nagai et al. |
| 2001/0052950 | A1 | | 12/2001 | Yamazaki et al. |
| 2002/0000551 | A1 | | 1/2002 | Yamazaki et al. |
| 2002/0127887 | A1 | | 9/2002 | Uehara et al. |
| 2002/0151156 | A1 | * | 10/2002 | Hallock et al. ............ 438/531 |
| 2003/0228740 | A1 | | 12/2003 | Nagai et al. |
| 2004/0224514 | A1 | | 11/2004 | Uehara et al. |
| 2008/0182209 | A1 | | 7/2008 | Nagai et al. |

FOREIGN PATENT DOCUMENTS

| EP | 0 314 185 | 5/1989 |
| EP | 0 409 543 | 1/1991 |
| EP | 1 032 026 | 8/2000 |
| JP | 61-086748 | 5/1986 |
| JP | 01-094342 | 4/1989 |
| JP | 02-084656 | 3/1990 |
| JP | 02-132448 | 5/1990 |
| JP | 02-166718 | 6/1990 |
| JP | 03-053587 | 3/1991 |
| JP | 03-192792 | 8/1991 |
| JP | 10-003169 | 1/1998 |
| JP | 11-176812 | 7/1999 |
| JP | 2000-241992 | 9/2000 |
| JP | 2001-216690 | 8/2001 |
| JP | 2002-033273 | 1/2002 |
| JP | 2004-006788 | 1/2004 |
| JP | 2004-517475 | 6/2004 |
| WO | 02/052349 | 7/2002 |

OTHER PUBLICATIONS

Hatano et al., "A Novel Self-aligned Gate-overlapped LDD Poly-Si TFT with High Reliability and Performance", IEDM 97; Technical Digest of International Electron Devices Meeting, Dec. 7, 1997, pp. 523-526.
Final Office Action dated Dec. 6, 2005 for U.S. Appl. No. 10/405,908.
Non-final Office Action dated Jun. 13, 2006 for U.S. Appl. No. 10/405,908.
U.S. Appl. No. 10/405,908, filed Apr. 3, 2003, Masaharu Nagai et al.

* cited by examiner

*Primary Examiner*—Daborah Chacko Davis
(74) *Attorney, Agent, or Firm*—Fish & Richardson P.C.

(57) ABSTRACT

It is an object to provide a technique for removing a resist favorably without leaving residue in the case of using a non-aqueous resist stripper. According to the present invention, in order to achieve the object, when a resist pattern is removed by using the nonaqueous resist stripper, it becomes easier to remove the resist pattern after dry etching or ion doping, by performing exposure treatment on the resist pattern. After a resist pattern is formed from a DNQ-novolac resin type of positive resist composition, the resist pattern is irradiated with light within the range of photosensitive wavelength of the DNQ photosensitizer, thereby removing the resist pattern with the nonaqueous resist stripper.

8 Claims, 9 Drawing Sheets
(2 of 9 Drawing Sheet(s) Filed in Color)

FIG.7A          0 (sec)

FIG.7E          100 (sec)

FIG.7B          5 (sec)

FIG.7F          300 (sec)

FIG.7C          10 (sec)

FIG.7G          500 (sec)

FIG.7D          30 (sec)

FIG.7H          750 (sec)   (Magnification×500)

FIG.8A  5 (sec)  (×500)

FIG.8B  30 (sec)  (×500)

FIG.8C  50 (sec)  (×1000)

FIG.9A 0 (sec)

FIG.9B 5 (sec)

FIG.9C 10 (sec)

FIG.9D 0 (sec)

FIG.9E 5 (sec)

FIG.9F 10 (sec)

METHOD FOR REMOVING RESIST PATTERN AND METHOD FOR MANUFACTURING SEMICONDUCTOR DEVICE

BACKGROUND OF THE INVENTION

1. Field of the Invention

The present invention relates to a method for removing a resist pattern that is formed in a photolithography process and a method for manufacturing a semiconductor device by using the method for removing a resist pattern. Specifically, the present invention relates to the technique for removing a resist pattern after an etching process or a doping process.

2. Description of the Related Arts

In recent years, active matrix liquid crystal display devices having circuits including TFTs are applied to the display screens of personal computers and television sets, and such various products are distributed in the market. In addition, active matrix EL display devices that are of the self-luminous type without backlights are developed for productization.

In the manufacture of a display device such as an active matrix liquid crystal display device or an EL display device, similarly to the case of an LSI (Large Scale Integrated Circuit) fabricating process, a thin film depositing process such as a CVD process, a photolithography process, an etching process, and a resist removing process are repeatedly performed to form a fine device pattern. The photolithography process is a process for forming a resist pattern which becomes a base for the device pattern, the etching process is a process for forming the device pattern for etching an underlying-layer film by using the resist pattern as a mask, and the resist removing process is a process for removing an unnecessary resist pattern after the etching process.

The above-described photolithography process is the process for forming a resist pattern which becomes a mask in etching, and in the process of manufacturing the display device, a diazonaphthoquinone (hereinafter abbreviated to DNQ)-novolac resin type of positive resist is generally used as a resist material. For an aligner used in the photolithography process, a 1:1 projection aligner (1:1 projection exposure system) which uses multiple-wavelength light including g-line (436 nm), h-line (405 nm) and i-line (365 nm) which are spectral light of an ultra high pressure mercury lamp, or a 1:1 projection aligner using single-wavelength light (abbr. a 1:1 stepper) of g-line or i-line of an ultra high pressure mercury lamp is used. With regard to specific processes of the photolithography process, the case where the 1:1 projection aligner of multiple-wavelength light is used is different from the case where the 1:1 projection aligner of single-wavelength light is used.

The photolithography process in the case where the 1:1 projection aligner of multiple-wavelength light is used includes a series of steps: resist coating→prebake (approximately at 100° C.)→exposure→development→postbake (approximately at 120° C.). The photolithography process in the case where the 1:1 projection aligner of single-wavelength light is used includes a series of steps: resist coating→prebake (approximately at 100° C.)→exposure→bake after exposure (Post Exposure Bake, hereinafter, PEB) (approximately at 120° C.)→development→postbake (approximately at 120° C.).

A resist pattern formed in the photolithography process serves as a mask in dry etching or wet etching, and it is necessary to remove the unnecessary resist pattern after the etching process. Thus, a resist removing process which includes an ashing process and a resist stripping treatment is performed for the purpose of removing such unnecessary resist pattern. The ashing process is the step of decomposing a resist pattern into a carbon dioxide gas by means of oxygen plasma. The resist stripping treatment is the step of dipping a substrate after an ashing process into an organic resist stripper adjusted to a predetermined temperature and dissolving and removing a resist pattern by using the dissolution action of the resist stripper.

However, in the resist removing process, it is known that a resist pattern after doping or dry etching becomes difficult to remove. For example, when a resist pattern over a substrate passes through a dry etching process, the reaction of polymers which constitute a resist pattern with an etching gas and the cross-linking reaction between the polymers proceed and a deteriorated layer difficult to remove is produced over the surface of the resist pattern. The deteriorated layer is stable and is difficult to remove by ashing. The speed of ashing is improved by adding a predetermined ratio of hydrogen or nitrogen to oxygen which is an ashing gas. Alternatively, the speed of ashing is also improved by adding a halogen gas such as $CF_4$ to oxygen which is an ashing gas. However, since there is a problem of an etching-damage of a base material due to the selectivity of the resist pattern to the base material, the applicable scope of the ashing process is restricted. Further, there is also a problem of a corrosion or etching of a base material caused by using a resist stripper having strong removing ability in the resist stripping treatment after an ashing process.

SUMMARY OF THE INVENTION

The present invention has been made in view of the above-described problems. It is an object of the present invention to provide a technique for removing a resist favorably without residue in the resist removing process after doping or etching. More specifically, the present invention provides the technique for easily removing a resist pattern after dry etching or ion doping.

According to the present invention, when a resist pattern is removed by using a resist stripper, such removal of the resist pattern after dry etching or ion doping is performed, is facilitated by performing an exposure treatment on the resist pattern. On this occasion, the resist pattern formed of a positive photoresist composition containing a photosensitizer is exposed to light, whereupon the photosensitizer is decomposed allowing a molecular weight thereof to be reduced and, accordingly, resistance of the resist pattern is reduced to facilitate the removal of the resist pattern. Namely, an unexposed portion of the resist pattern is subjected to the exposure treatment before the resist pattern is removed, whereupon the photosensitizer is decomposed, thereby facilitating the removal of the resist pattern by the resist stripper.

It is sufficient to perform the exposure treatment on the resist pattern before the resist pattern is treated by the resist stripper, and before or after a dry-etching process is performed. In another case, it is also sufficient to perform the exposure treatment after the resist pattern is treated by the resist stripper, and then the resist composition is treated by a developer, thereby removing it. A method for manufacturing a semiconductor device based on a gist of the present invention is described below.

The method for manufacturing the semiconductor device comprises a first step of forming a resist pattern comprising a positive resist composition containing a photosensitizer on a material to be processed; a second step of emitting light within a photosensitive wavelength region of the photosensitizer on the resist pattern; a third step of performing a dry-etching process on the material to be processed by using the resist pattern as a mask; and a fourth step of performing a resist removing process on the resist pattern.

Further, the method for manufacturing the semiconductor device comprises a first step of forming a resist pattern comprising a positive resist composition containing a photosensitizer on a material to be processed; a second step of performing a dry-etching process on the material to be processed by using the resist pattern as a mask; a third step of emitting light within a photosensitive wavelength region of the photosensitizer on the resist pattern; and a fourth step of performing a resist removing process on the resist pattern.

Still further, the method for manufacturing the semiconductor device comprises a first step of forming a resist pattern comprising a positive resist composition containing a photosensitizer on a material to be processed; a second step of performing a dry-etching process on the material to be processed by using the resist pattern as a mask; a third step of performing a resist removing process on the resist pattern; a fourth step of emitting light within a photosensitive wavelength region of the photosensitizer on the resist pattern; and a fifth step of, after the fourth step, treating an unreacted positive resist composition (an unprocessed portion of the positive resist pattern) by a developer.

According to the present invention as described above, a representative example of the positive resist composition containing the photosensitizer is a diazonaphthoquinone (hereinafter referred to also as "DNQ" in short)-novolac resin type and the example of the photosensitizer is diazonaphthoquinone (DNQ). In another case, a chemical amplification-type positive resist composition may be used. Further, the resist removing process, which is performed after the dry-etching process is performed in order to remove an unnecessary resist pattern, comprises an ashing process and a resist stripping treatment. The term "ashing process" as used herein is intended to include decomposing the resist pattern into a carbon dioxide gas by using oxygen plasma. On the other hand, the term "resist stripping treatment" as used herein is intended to include dipping a substrate after the ashing process is performed in the resist stripper which is adjusted to have a predetermined temperature whereupon the resist pattern is dissolve-removed by making use of a dissolving action of the resist stripper.

In the resist pattern after the dry-etching process is performed, a reaction between a polymer and an etching gas or a cross-linking reaction between polymers is advanced to generate a deteriorated layer which is difficult to remove on a surface of the resist pattern. For this reason, the ashing process is applied for removing the deteriorated layer while the resist stripping treatment is applied for removing the resist pattern remaining after such removal of the deteriorated layer. According to the present invention, resistance of the resist is reduced by decomposing the photosensitizer by exposure thereby decreasing a molecular weight thereof whereupon a stripping property is enhanced. As another possibility, a large quantity of indene-carboxylic acid which is a product derived from the photosensitizer by a photochemical reaction is produced inside the resist pattern by emitting light within a photosensitive wavelength region of the photosensitizer on the resist pattern after a development treatment is performed. It is conceivable that, in regard to the resist pattern after a dry-etching process is performed, such production of the indene-carboxylic acid serves to promote solubility to the stripper of a resist material remaining after the deteriorated layer of a surface layer portion is removed by the ashing process. Because of this feature, it is possible that by the ashing process and the resist stripping treatment, a removal treatment of the resist pattern after the dry-etching process is performed, is fully executed without leaving resist residue. Further, even after one conductivity type of an impurity ion is accelerated in an electric field to be doped, it is possible that the resist pattern is removed in the same manner as described above.

A light irradiation device necessary in an exposure treatment is a treating device for emitting light within a photosensitive wavelength region of the photosensitizer on the resist pattern after subjected to the development treatment whereupon, for example, light having a wavelength of from 350 nm to 450 nm becomes necessary as light within a photosensitive wavelength region of a DNQ photosensitizer and an ultra high-pressure mercury lamp is exemplified as a favorable example of a light source which satisfies the wavelength region. The ultra high-pressure mercury lamp has spectral light of a g-line (436 nm), an h-line (405 nm) or an i-line (365 nm) which satisfies the wavelength region whereupon spectral light of these rays can be utilized either each individually or in any combination thereof. When a plurality of these spectral lights are used, the light irradiation device comprises an ultra high-pressure mercury lamp which is a light source and an optical filter for spectrally transmitting a specified wavelength region containing two wavelengths or more selected from the group consisting of the g-line, h-line and i-line which are in the wavelength region of from 350 nm to 450 nm of the ultra high-pressure mercury lamp. On this occasion, as for the optical filters, an optical filter which spectrally transmits a wavelength region containing all of the g-line (436 nm), h-line (405 nm), and i-line (365 nm), an optical filter which spectrally transmits a wavelength region containing only the g-line (436 nm) and h-line (405 nm), and an optical filter which spectrally transmits a wavelength region containing only the h-line (405 nm) and i-line (365 nm) are considered from the standpoint of types of spectral transmittance characteristics whereupon any type of optical filter may be used. On the other hand, when a single spectral light ray is used, the light irradiation device comprises an ultra high-pressure mercury lamp which is a light source and an optical filter for spectrally transmitting a light having a single wavelength comprising a g-line (436 nm), an h-line (405 nm), or an i-line (365 nm) of the ultra high-pressure mercury lamp. Further, as for the optical filters which are each a constitutional member of the light irradiation device, exemplified are an absorption filter and a thin-film interference filter whereupon these filters are appropriately laminated to allow a desired wavelength region to be spectrally transmitted.

According to the present invention, by performing a development treatment and an exposure treatment in which light in a photosensitive wavelength region of the photosensitizer is emitted on the resist pattern after developed, solubility thereof to the resist stripper is promoted and, even after the dry-etching process or a doping treatment is performed, peeling of the resist pattern can be facilitated.

BRIEF DESCRIPTION OF THE DRAWINGS

The patent or application file contains at least one drawing executed in color. Copies of this patent or application publication with color drawing(s) will be provided by the Office upon request and payment of the necessary fee.

In the accompanying drawings.

DESCRIPTION OF THE PREFERRED EMBODIMENTS

Illustrative embodiments according to the present invention are now described in detail with reference to the accompanying drawings. It is easily understood by those who are in the art that embodiments and details herein disclosed can be modified in various ways without departing from the scope and spirit of the present invention. Therefore, it should be noted that the description of embodiments to be given below should not be interpreted as limiting the present invention. Further, in constitutions according to the present invention to be described below, similar parts among different drawings are marked with the same reference symbols, or numerals.

Embodiment Mode 1

An embodiment mode of embodiment modes according to the present invention is described with reference to FIGS. 1A to 1D. According to the present invention, any of various types of materials such as glass, quartz, a semiconductor, plastics, a plastic film, metal, a glass-epoxy resin, and ceramics are used as a substrate, and then in order to form given patterns including a wiring pattern and a contact hole, a mask pattern is formed by using a photoresist with means of a photolithography process, and thereafter the thus-formed mask pattern can be applied in all steps in which an etching process is performed.

Figure 1A:
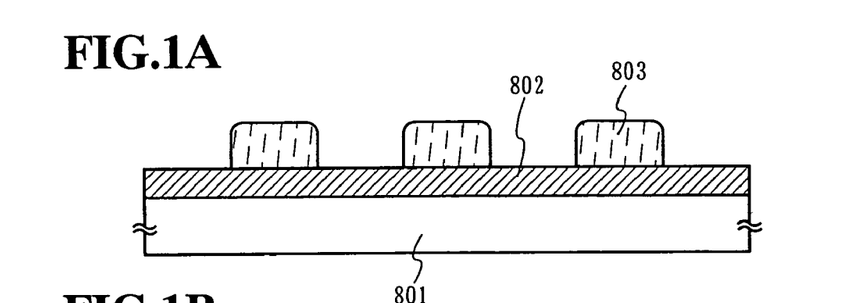
FIGS. 1A to 1D are cross sectional diagrams showing a resist removing process according to the present invention.

As shown in FIG. 1A, a metal film 802 is formed on a glass substrate 801, and then, a resist pattern 803 is formed by a photolithography process including application, baking, exposure, post-baking, and the like of the photoresist.

A material of the metal film 802 is not particularly limited and any material is permissible so long as a dry-etching process can preferably be performed. Materials such as aluminum, titanium, molybdenum, tantalum, and tungsten or an alloy containing any of these elements can be applied. Further, in Embodiment Mode 1, a metal film is illustratively used as a material to be subjected to the etching process, but the present invention is not limited thereto whereupon a semiconductor film of, for example, silicon or germanium, and an insulating film of, for example, silicon oxide or silicon nitride can be applied as a material to be processed.

The resist pattern 803 is permissible so long as it uses a positive resist composition containing a photosensitizer, and, representatively, uses that of a DNQ-novolac resin type. In another case, chemical amplification-type positive resist composition may be used. In this step, the DNQ-novolac resin type of positive resist is applied by a spin coating method, and then subjected to a pre-baking treatment at a treating temperature of about 100° C. for a predetermined period of time to form a resist film having a predetermined thickness. The pre-baking treatment is performed for the purpose of evaporating a solvent present in a resist film to allow it to be stable. Subsequently, an exposure treatment is performed for a predetermined period of time by using a 1:1 projection aligner utilizing light having a multiple of wavelengths (e.g., g-line, h-line, and i-line), and then a development treatment is performed for a predetermined period of time by using a developer (2.38%) of tetramethyl hydroxide (hereinafter referred to also as "TMAH" in short; chemical formula: $(CH_3)_4NOH$) which is an organic alkaline developer to form the resist pattern 803 having a predetermined size.

Figure 1B:
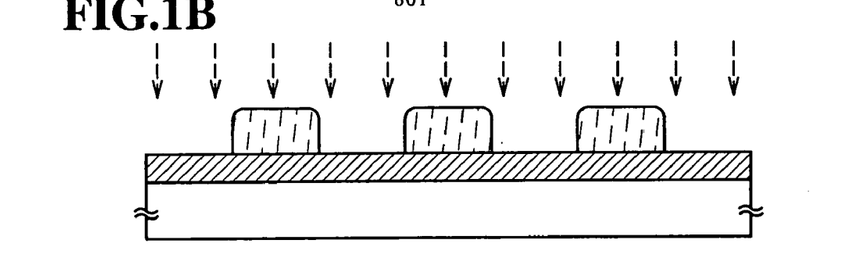

Next, in order to expose an unreacted DNQ photosensitizer present inside the resist pattern 803 after developed, light having a wavelength in the range of from 350 nm to 450 nm corresponding to light within a photosensitive wavelength region of the DNQ photosensitizer is emitted on an entire surface of the substrate (see FIG. 1B). As for light having a wavelength in the range of from 350 nm to 450 nm, a g-line (436 nm), an h-line (405 nm), or an i-line (365 nm) which is a spectral light of an ultra high-pressure mercury lamp is exemplified as a favorable example and, in Embodiment Mode 1, light having a multiple of wavelengths comprising the g-line (436 nm), h-line (405 nm), and i-line (365 nm) of the ultra high-pressure mercury lamp is emitted on the resist pattern 803 after developed. By such irradiation, the photosensitizer contained in the resist pattern 803 is exposed to decrease a molecular weight thereof, and accordingly, to reduce the resistance of resist, thereby enhancing a peeling property. In another case, by emitting light within the photosensitive wavelength region of the DNQ photosensitizer on the resist pattern after developed, a large quantity of indene-carboxylic acid which is a photochemical reaction product derived from the DNQ photosensitizer is produced inside the resist pattern. Light having a multiple of wavelengths has a large irradiation light quantity compared with light having a single-wavelength whereupon the DNQ photosensitizer present inside the resist pattern 803 after developed can be exposed in a shorter period of time.

Figure 1C:
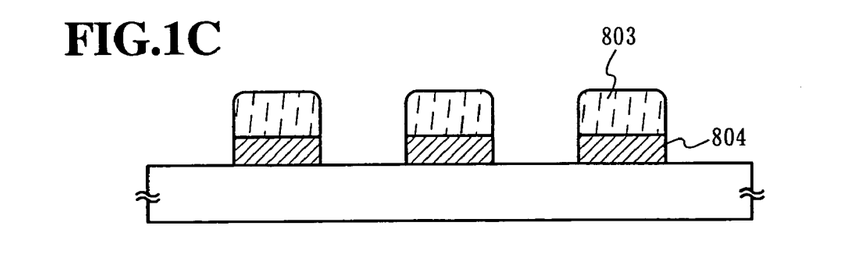

After the exposure treatment is performed, the metal film 802 is subjected to etching by a dry-etching process (see FIG. 1C). Such dry-etching may appropriately be selected in accordance with objects or applications whereupon methods such as reactive ion etching, ECR plasma etching, and inductively coupled plasma etching can be applied. An etching gas may be selected in accordance with materials to be processed whereupon a fluorine-based etching gas such as $CF_4$, $NF_3$, and $SF_6$, or a chlorine-based etching gas such as $Cl_2$, and $BCl_3$ can be used.

Figure 1D:
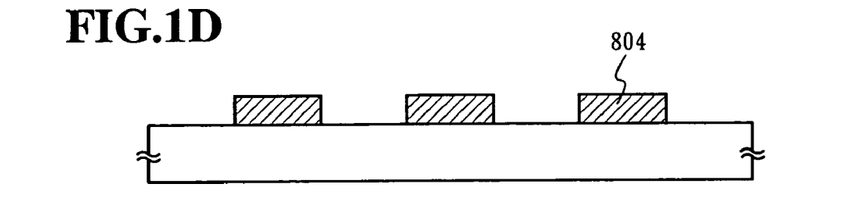

Next, an ashing process and a resist stripping treatment by using a resist stripper are performed on the resist pattern 803 which becomes a mask for the dry-etching process (see FIG. 1D). In the resist pattern 803 after the dry-etching process is performed, a reaction between a polymer which constitutes the resist and the etching gas or a cross-linking reaction between polymers is advanced to produce a deteriorated layer on a surface of the resist pattern 803. In order to perform a removal treatment on the deteriorated layer, an ashing process which decomposes the deteriorated layer into a carbon dioxide gas by oxygen plasma is favorable while, in order to perform a removal treatment on the resist pattern after the deteriorated layer is removed, a resist stripper comprising a mixture of 2-aminoethanol and a glycol ether as a composition is used. Further, in Embodiment Mode 1, the light having a multiple of wavelengths comprising the g-line (436 nm), h-line (405 nm), and i-line (365 nm) of the ultra high-pressure mercury lamp is emitted on the resist pattern 803 before the dry-etching process is performed to produce a large quantity of indene-carboxylic acid. Therefore, in regard to a resist material remaining after the deteriorated layer on the surface layer portion is removed by an ashing process, solubility thereof to the resist stripper is promoted whereupon, by performing a resist stripping treatment, it is possible to completely remove the resist without leaving resist residue.

In such manner as described above, a pattern of the metal film 804 can be formed on the glass substrate 801. Further, in Embodiment Mode 1, an embodiment mode of forming the pattern comprising the metal film 804 on the glass substrate 801 was shown, but the present invention is by no means limited to the embodiment mode and can be applied also to various fields such as a step for forming wiring and a step for forming a contact hole, of a semiconductor integrated circuit, and a step for forming a silicon island, a step for forming wiring and a step for forming a contact hole of a TFT substrate, for fabricating a liquid crystal panel or an EL panel. Namely, the present invention is not limited to removing the metal film illustrated herein and can be applied also to removing an insulating film made of, for example, silicon oxide or an acrylic resin, and a resist pattern to be formed on a semiconductor film made of, for example, polycrystalline silicon or amorphous silicon.

Embodiment Mode 2

Another embodiment mode of embodiments according to the present invention different from Embodiment Mode 1 is described with reference to FIGS. 2A to 2D. Similar members corresponding to those in Embodiment Mode 1 are not described.

Figure 2A:
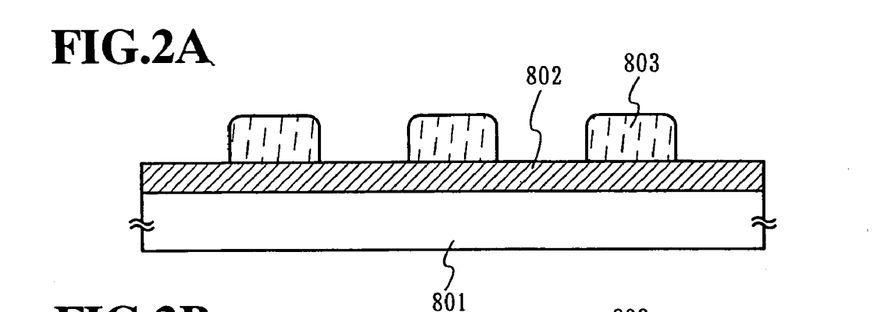
FIGS. 2A to 2D are cross sectional diagrams showing a resist removing process according to the present invention.
Figure 2B:
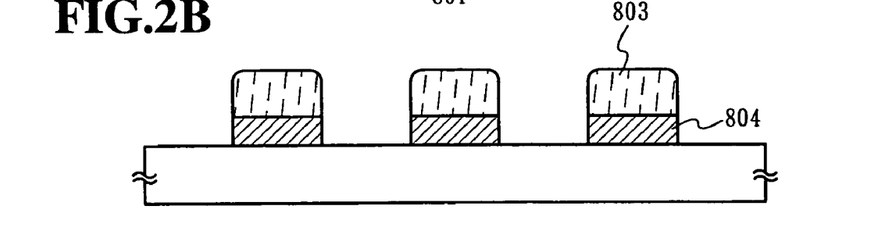

In FIG. 2A, a metal film 802 and a resist pattern 803 are formed on a glass substrate 801 in the same manner as in Embodiment Mode 1. Thereafter, as shown in FIG. 2B, a dry-etching process is performed. In the resist pattern 803 after the dry-etching process is performed, a reaction between a polymer which constitutes a resist and an etching gas or a cross-lining reaction between polymers is advanced to produce a deteriorated layer which is difficult to remove on a surface of the resist pattern 803. At this stage, an exposure treatment may be performed in order to facilitate removal of not only the deteriorated layer but also the resist pattern 803.

Figure 2C:
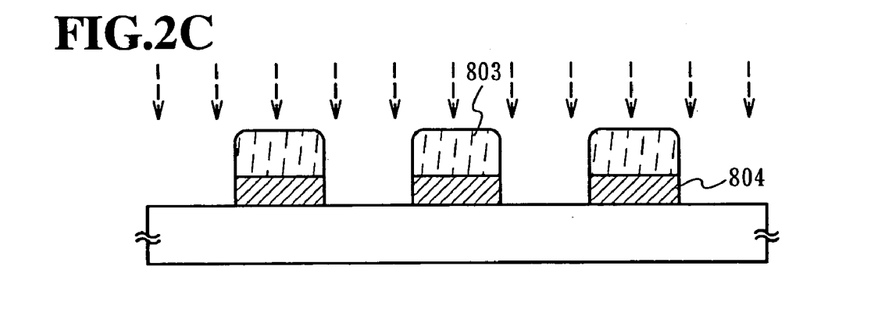
Figure 2D:
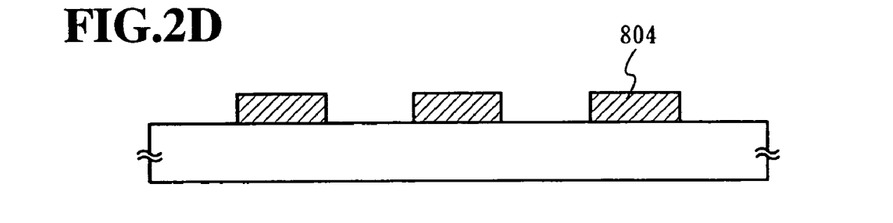

The term "exposure treatment" as used herein is intended to include irradiation of light having a wavelength of from 350 nm to 450 nm which is light within a photosensitive wavelength region of a DNQ photosensitizer on an entire surface of a substrate whereby an unreacted DNQ photosensitizer present inside the resist pattern 803 after a dry etching process is allowed to be exposed (see FIG. 2C). The removal treatment of the deteriorated layer is mainly performed by an ashing process with means of oxygen plasma and the removal treatment of the photoresist pattern after the deteriorated layer is removed, is performed by using a dissolution treatment by using a resist stripper comprising a mixture of 2-aminoethanol and a glycol ether as a composition (see FIG. 2D).

Even through such steps as described above, removal of the resist pattern after the dry-etching is performed can be easily executed in the same manner as in Embodiment Mode 1.

Embodiment Mode 3

Still another embodiment mode of embodiments according to the present invention different from Embodiment Modes 1 and 2 is described with reference to FIGS. 3A to 3E. Like members corresponding to those in Embodiment Mode 1 or 2 are not described.

Figure 3A:
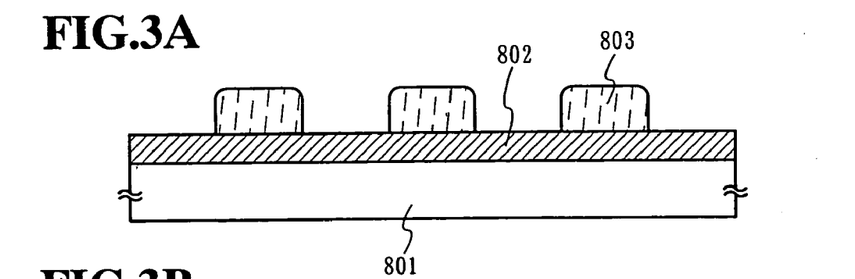
FIGS. 3A to 3E are cross sectional diagrams showing a resist removing process according to the present invention.
Figure 3B:
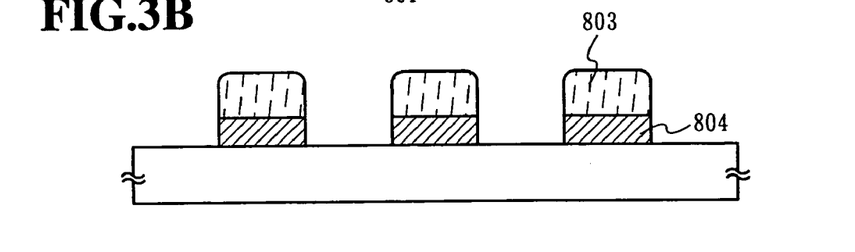
Figure 3C:
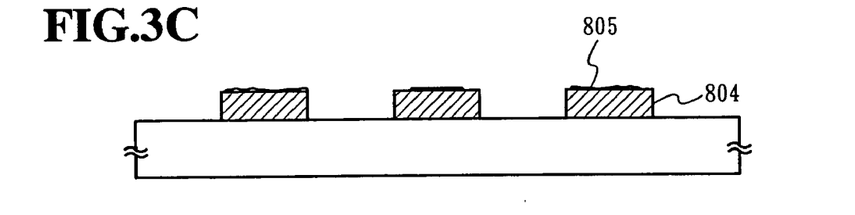
Figure 3D:
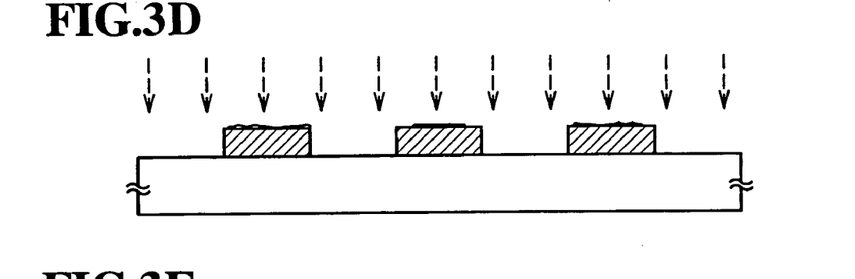
Figure 3E:
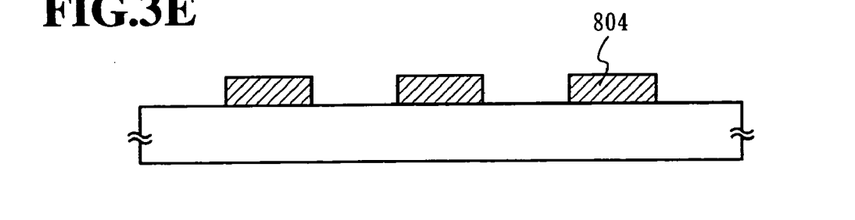

In FIG. 3A, a metal film 802 and a resist pattern 803 are formed on a glass substrate 801 in the same manner as in Embodiment Mode 1. Thereafter, as shown in FIG. 3B, a dry-etching process is performed. In the resist pattern 803 after the dry-etching process is performed, a reaction between a polymer which constitutes a resist and an etching gas or a cross-linking reaction between polymers is advanced to produce a deteriorated layer which is difficult to remove on a surface of the resist pattern 803. Therefore, even when, subsequently to the above treatment, an ashing process and a resist stripping treatment of the resist by a resist stripper are performed, a residue 805 is left (see FIG. 3C).

In order to remove the residue 805, it is effective to perform an exposure treatment at this stage. The exposure treatment is to emit light having a wavelength of from 350 nm to 450 nm which is light within a photosensitive wavelength region of a DNQ photosensitizer on an entire surface of a substrate whereby an unreacted DNQ photosensitizer present inside the resist pattern 803 which is formed of a DNQ-novolac resin type of positive resist composition is allowed to be exposed (see FIG. 3D). Thereafter, the residue 805 can be removed by performing a treatment by a developer (see FIG. 3E).

Even through such steps as described above, removal of the resist pattern after the dry-etching is performed can easily be executed in the same manner as in Embodiment Mode 1 or 2.

Embodiment Mode 4

In the following description of Embodiment Mode 4, based on FIGS. 5A to 5F and 6A to 6C, reference will be made to the case where the resist pattern forming method according to the present invention is applied to a gate electrode forming process included in a TFT fabricating process.

Figure 5A:
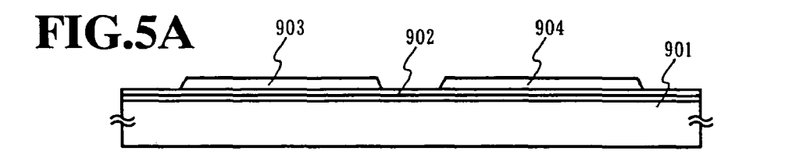
FIGS. 5A to 5F are cross sectional diagrams showing a TFT fabricating process including a resist removing process according to the present invention.

The shown substrate includes a glass substrate 901 which is an electrically insulating transparent substrate, and a base film 902 comprising a silicon oxynitride film having a film thickness of 150 nm is deposited over the glass substrate 901, and a semiconductor layer which is a TFT active layer comprising polycrystalline silicon films 903 and 904 having a film thickness of 50 nm is formed over the base film (FIG. 5A).

Figure 5B:
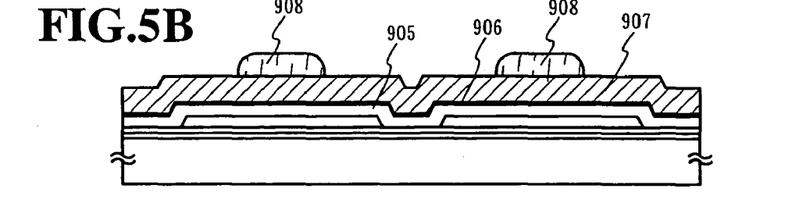

A gate insulating film 905 comprising a silicon oxide film having a film thickness of 100 nm, a first-layer gate electrode film 906 comprising a TaN film having a film thickness of 30 nm, and a second-layer gate electrode film 907 comprising a W film having a film thickness of 370 nm are laminated and deposited to coat the semiconductor layers 903 and 904 (FIG. 5B).

The film thickness of the first-layer gate electrode film (TaN film) 906 is set in view of both the controllability of the thickness of the TaN film to be left in a taper-shaped region during taper etching and the doping characteristics during doping of an impurity element through the TaN film by a through-doping method. It is known that the film thickness of the second-layer gate electrode film (W film) 907 needs to be not smaller than 340 nm thick so that the occurrence of a channeling phenomenon in the W film can be prevented during doping of an impurity element. Therefore, the film thickness of the second-layer gate electrode film 907 is set in view of this point. Incidentally, in this embodiment mode, the method for adding a layer to be doped with impurities by passing the impurities through a film overlying the objective layer to be doped is herein referred to as "a through-doping method" for the sake of convenience.

A resist pattern 908, for forming the gate electrode, which includes a DNQ-novolac resin type of positive resist is formed over the substrate having the above-described structure. At this time, a resist film is formed to have a predetermined film thickness by applying the DNQ-novolac resin type of positive resist composition to the substrate by spin coating and performing a prebake treatment for a predetermined time at a treating temperature of approximately 100° C. Incidentally, the prebake treatment serves to evaporate the solvent contained in the film to which a resist is applied and form a stable resist film. After that, a predetermined time of exposure treatment is performed with a 1:1 projection aligner using multiple-wavelength light (g-line, h-line and i-line) of an ultra high pressure mercury lamp, and then a predetermined time of developing treatment is performed with a TMAH developer (2.38%) which is an organic alkaline developer, thereby forming the resist pattern 908 aligned with of the position of the gate electrode (FIG. 5B).

Figure 5C:
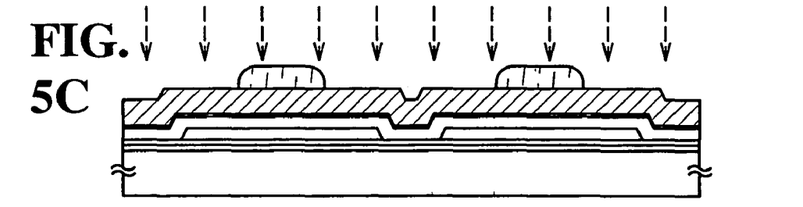

Then, in order to photosensitive an unreacted DNQ photosensitizer which exists in the interior of the developed resist pattern 908, the entire surface of the substrate is irradiated with light having a wavelength between 350 nm and 450 nm which is light within the range of photosensitive wavelength of the DNQ photosensitizer. In this case, suitable examples of the light having the wavelength between 350 nm and 450 nm are g-line (436 nm), h-line (405 nm) and i-line (365 nm) which are spectral light of the super high pressure mercury lamp, and in this embodiment mode, the developed resist pattern 908 is irradiated with multiple-wavelength light including g-line (436 nm), h-line (405 nm) and i-line (365 nm) of the super high pressure mercury lamp. Through this light irradiation process, a large amount of indene carboxylic acid which is a photochemical reaction product from the DNQ photosensitizer is produced in the interior of the resist pattern 908 (FIG. 5C).

Figure 5D:
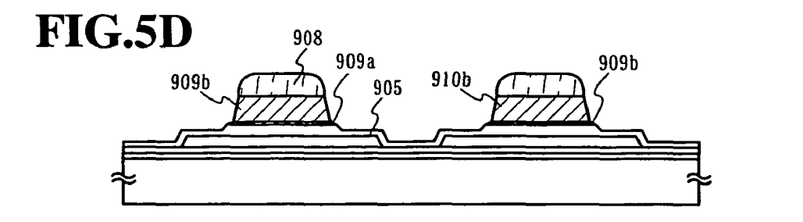
Figure 5E:
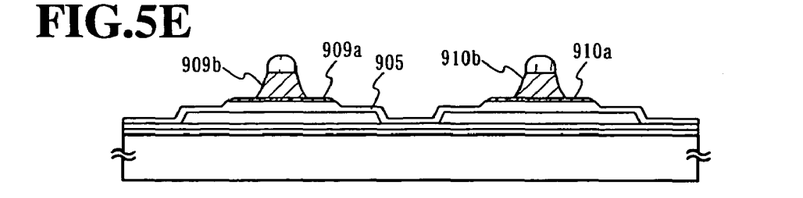
Figure 5F:
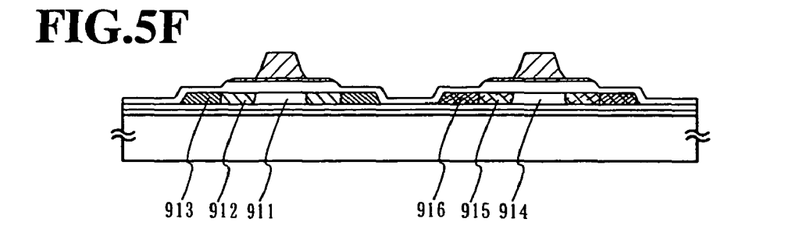

Then, a three-step etching process which is composite etching process including taper etching process and anisotropic etching process is performed by using the resist pattern 908 as a mask, thereby forming a gate electrode comprising first-layer gate electrodes 909a and 910a including the TaN film each having a forwardly tapered shape and second-layer gate electrodes 909b and 910b including the W film each having a shape close to a rectangle. An ICP dry etching apparatus is used as a dry etching apparatus, and etching is performed while the resist pattern 908 recedes by lowering selectivity relative to the resist pattern 908 (FIGS. 5D and 5E).

Specific processing of the three-step etching process is as follows. Namely, as the first step of the etching process, only the second-layer gate electrode film 907 formed of the W film is taper-etched by using the resist pattern 908 as a mask to form the second-layer gate electrodes 909b and 910b each having a forwardly tapered shape. The etching conditions for this taper etching are as follows: the flow rate of $CF_4$, $Cl_2$ and $O_2$ in a mixed gas thereof are 25 sccm ($CF_4$), 25 sccm ($Cl_2$) and 10 sccm ($O_2$), respectively; ICP power is 500 W (ICP power density: 1.019 $W/cm^2$); bias power is 150 W (bias power density: 0.96 $W/cm^2$); and gas pressure is 1.0 Pa, and the dry etching process is performed for an etching time determined by adding the time of 10% overetching to the time of just etching (generally, approximately 120 seconds). Incidentally, the resist pattern 908 which serves as a mask during the dry etching process is deformed by the resist-receding phenomenon.

Subsequently, as the second step of the etching process, the first-layer gate electrode 906 including the TaN film is anisotropically etched by using the second-layer gate electrodes 909b and 910b each including the W film as a mask to form the first-layer gate electrodes 909a and 910a. The etching conditions for this anisotropic etching are as follows: the flow rate of $CF_4$ and $Cl_2$ in a mixed gas thereof are 30 sccm ($CF_4$) and 30 sccm ($Cl_2$), respectively; ICP power is 500 W (ICP power density: 1.019 $W/cm^2$); bias power is 10 W (bias power density: 0.064 $W/cm^2$); and gas pressure is 1.0 Pa, and the dry etching process is performed for an etching time determined by adding 15 seconds of overetching to the time of just etching (generally, approximately 45 seconds). Incidentally, the resist pattern 908 is deformed. In addition, the thickness of the gate insulating film 905 including a silicon oxide film is reduced by the dry etching process and the gate insulating film 905 is deformed (FIG. 5D).

Subsequently, as the third step of the etching process, second-layer gate electrodes 909b and 910b including the W film are anisotropically etched by using the resist pattern 908 as a mask to form the second-layer gate electrodes 909b and 910b each having a shape close to a rectangle and the first-layer gate electrodes 909a and 910a each having a forwardly tapered shape. The etching conditions for this anisotropic etching are as follows: the flow rate of $SF_6$, $Cl_2$ and $O_2$ in a mixed gas thereof are 24 sccm ($SF_6$), 12 sccm ($Cl_2$) and 24 sccm ($O_2$), respectively; ICP power is 700 W (ICP power density: 1.427 $W/cm^2$); bias power is 4 W (bias power density: 0.026 $W/cm^2$); and gas pressure is 1.3 Pa, and the dry etching process is performed for a fixed etching time of 25 seconds. Incidentally, the thickness of the gate insulating film 905 including a silicon oxide film is reduced to a further extent by the dry etching process and the resist pattern 908 recedes to a further extent and is deformed.

Then, a resist removing process which includes an ashing process and a resist stripping treatment is performed on the resist pattern 908 which serves as the mask during the dry etching process. In the resist pattern 908 after the dry etching process, since the reaction of polymers which constitute the resist with the etching gas and the cross-linking reaction between the polymers proceed, a deteriorated layer difficult to remove is produced on the surface of the resist pattern 908. The ashing process which is the treatment of effecting decomposition into a carbon dioxide gas by means of oxygen plasma is suited for the treatment of removing the deteriorated layer. The resist removing treatment which is dissolution treatment using an organic resist stripper is suited for the treatment of removing the resist pattern after the removal of the deteriorated layer. For this reason, in this embodiment mode 4, after the treatment of removing the deteriorated layer by means of the ashing process has been performed, the resist removing treatment by using an organic resist stripper is performed. Incidentally, the resist pattern 908 after the dry etching process contains a large amount of indene carboxylic acid which is produced by the irradiation of multiple-wavelength light formed of g-line (436 nm), h-line (405 nm) and i-line (365 nm) of the super high pressure mercury lamp. Accordingly, the resist material which is left when the deteriorated layer is removed from the surface portion of the resist pattern by ashing is promoted in its solubility in the resist stripper, whereby it is possible to completely remove the resist material without leaving resist residue through the resist stripping treatment.

Then, a high dose of n-type impurity including P (phosphorus) element is added by using an ion doping device. A heavily doped n-type impurity region (n+ region) 913 is formed in a region of the semiconductor layer 903 that is not overlapped with the first-layer gate electrode 909a by through-doping. The semiconductor layer 903 is a polycrystalline silicon film. At the same time, a lightly doped n-type impurity region (n− region) 912 is formed by through-doping in a region of the semiconductor layer 903 that is overlapped with 909a but not overlapped with 909b. The heavily doped impurity region (n+ region) 913 formed in this manner has the function of the source region or the drain region of the TFT, while the lightly doped impurity region (n− region) 912 has the function of a LDD region serving as a field relaxing region which overlaps with the gate electrode. Further, a channel forming region 911 is formed in a region which overlaps with the second-layer gate electrode 909b.

On the contrary, the semiconductor layer 904 is doped with a high dose of p-type impurity including B (boron) element. A heavily doped p-type impurity region (p+ region) 916 is formed by through-doping in a region of the semiconductor layer 904 that is not overlapped with the first-layer gate electrode 910a by through-doping. The semiconductor layer 904 is a polycrystalline silicon film. At the same time, a lightly doped p-type impurity region (p− region) 915 is formed by through-doping in a region of the semiconductor layer 904 that is overlapped with 910a but not overlapped with 910b. Further, a channel forming region 914 is formed in a region which overlaps with the second-layer gate electrode 910b.

Figure 6A:
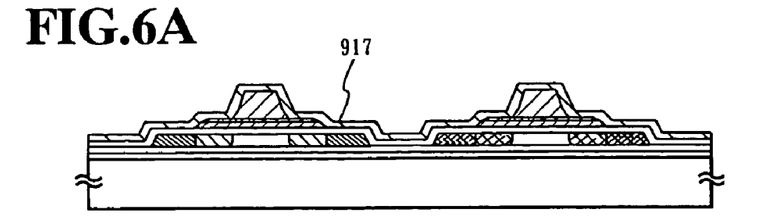
FIGS. 6A to 6C are cross sectional diagrams showing a TFT fabricating process including a resist removing process according to the present invention.

A silicon oxynitride film 917 containing hydrogen is formed to be 50 nm in thickness by a plasma CVD method and the semiconductor films is hydrogenated by a heat treatment at the temperature of 410° C. An activation treatment of the above-described impurity regions is also performed at the same time as the hydrogenation (FIG. 6A).

Figure 6B:
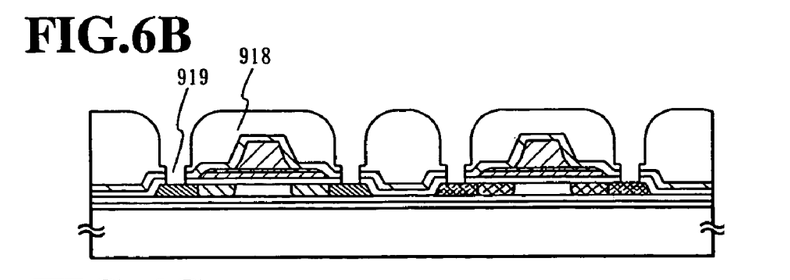

An interlayer insulating film 918 is made to a predetermined pattern by using a photosensitive organic resin composition including acrylic resin or polyimide composition mainly. When such a photosensitive organic resin composition is used, a contact hole 919 is formed at this time (FIG. 6B).

Figure 6C:
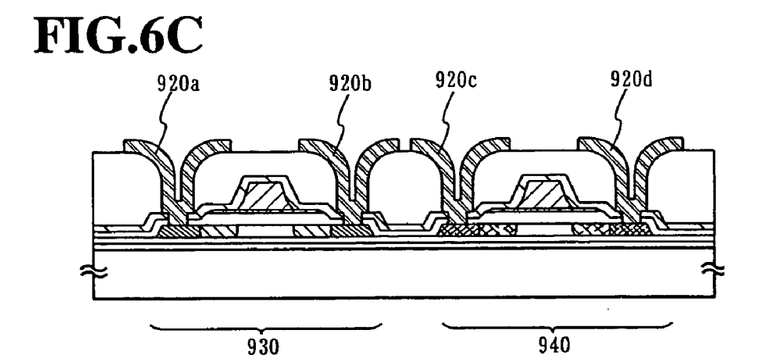
Figure 7A:
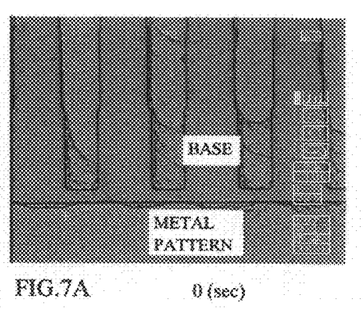
FIGS. 7A to 7H are photographs showing the state after a resist pattern is removed is magnified a 500 times under a light microscope.
Figure 7B:
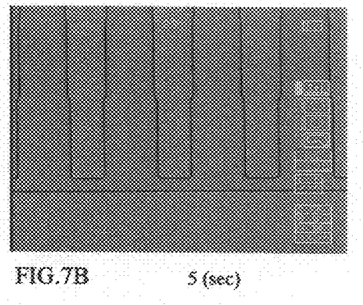
Figure 7C:
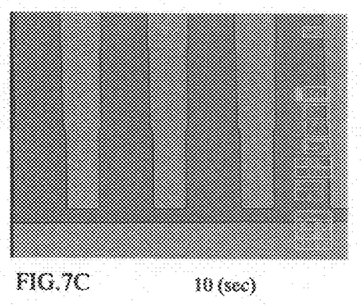
Figure 7D:
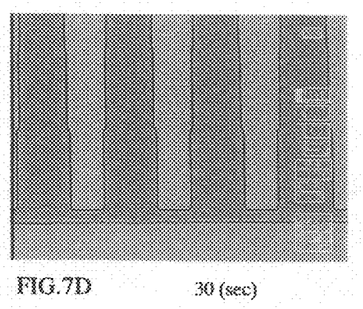
Figure 7E:
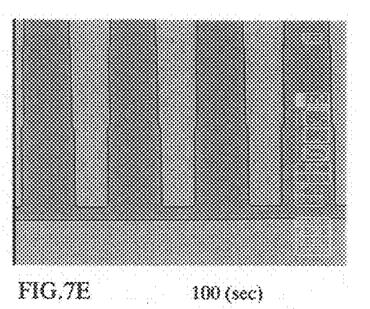
Figure 7F:
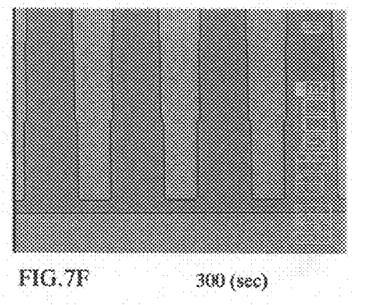
Figure 7G:
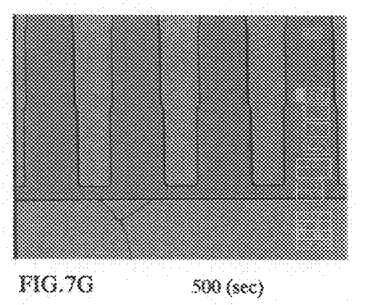
Figure 7H:
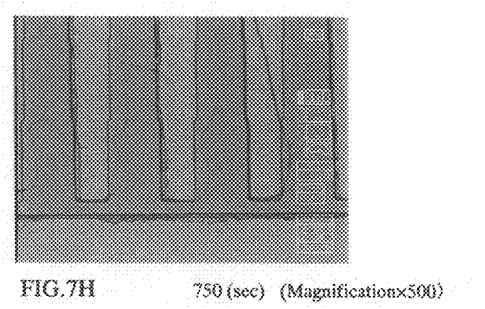

Subsequently, wirings 920a to 920d are formed with Al, Ti, Mo, or W. It is an example of the wiring structure that a Ti film having a film thickness of from 50 to 250 nm and an alloy film (of Al and Ti) having a film thickness of from 300 to 500 nm are laminated (FIG. 6C).

In the case where the present invention is applied to the process for fabricating an n-channel type TFT 930 and a p-channel type TFT 940, it is possible to achieve the following specific advantageous effects. The glass transition temperature of a resist pattern for forming a gate electrode is decreased by irradiating the resist pattern for forming a gate electrode with light having a wavelength of from 350 nm to 450 nm which is light within the range of photosensitive wavelength of a DNQ photosensitizer, whereby when the resist pattern is to be baked at a temperature not lower than the glass transition temperature, a decrease in a bake temperature for obtaining the desired sidewall angle of the resist pattern can be realized. In the case where the bake temperature is not decreased, the sidewall angle of the resist pattern can be made smaller owing to the promotion of softening and fluidization. In addition, in the processing of removing the resist pattern after the dry etching process, it is possible to completely remove the resist pattern without leaving resist residue, through the ashing process and the resist stripping treatment.

Embodiment Mode 5

Figure 4:
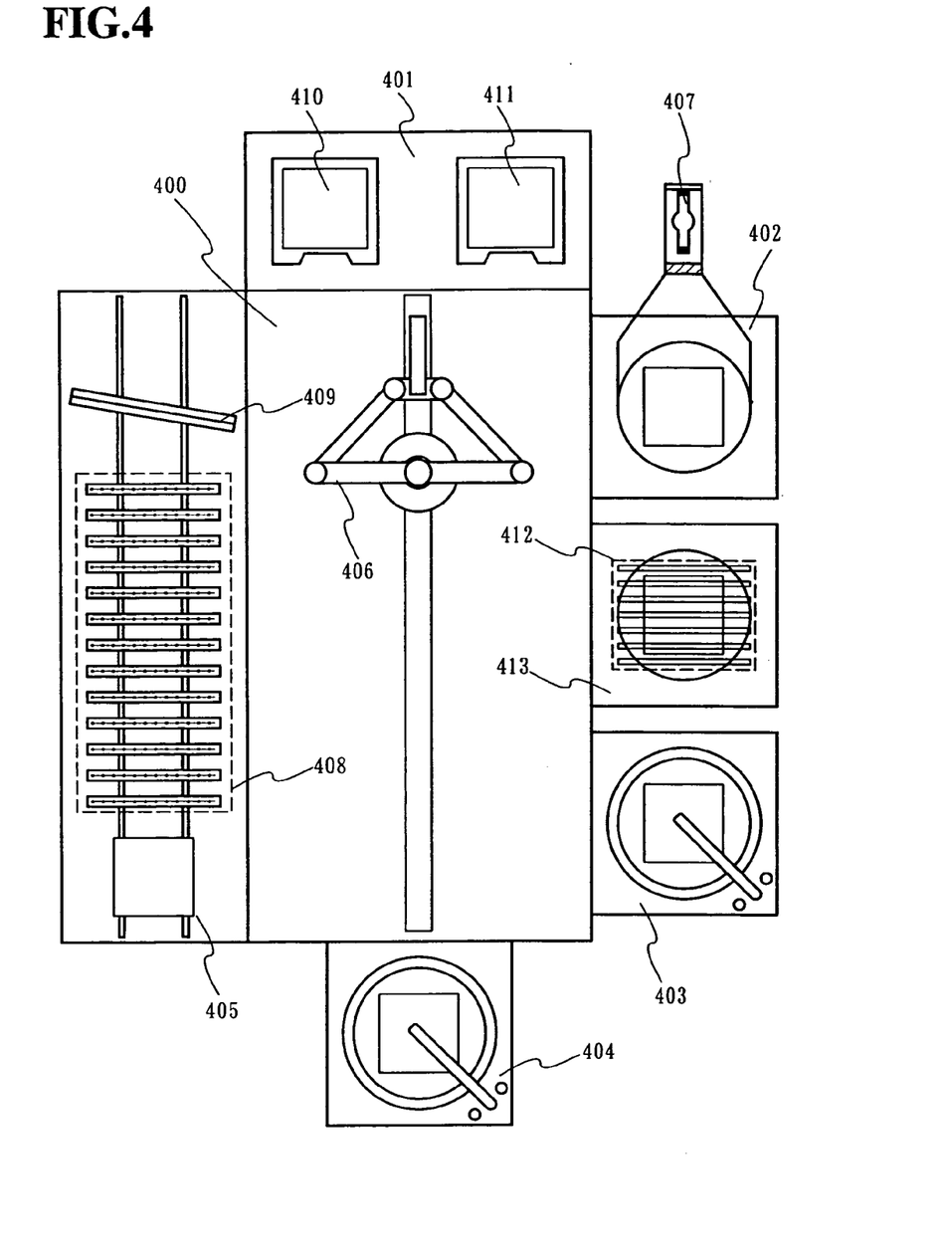
FIG. 4 shows a resist stripping apparatus equipped with an exposure treatment means according to the present invention.

As described in Embodiment Modes 1 to 4, removal of the resist can be facilitated by providing an exposure before and after a resist removing process. In FIG. 4, shown is an example of a resist stripping apparatus attached with an exposure treatment device.

The resist stripping apparatus as shown in FIG. 4, being of a sheet-base treatment system which can treat substrates to be processed on a sheet-by-sheet basis in a continuous manner, comprises a transport chamber 400 placed in a center position thereof, an exposure treatment chamber 402, stripping treatment chambers 403, 404, a rinsing chamber 405 and a loading/unloading chamber 401 around the transport chamber 400. The substrate to be treated is supplied from a substrate cassette 410 provided in the loading/unloading chamber 401 and collected by another substrate cassette 411. The substrate is transported to each chamber by a transporting device 406 provided in the transport chamber 400. The stripping treatment chambers 403, 404 are each a treating chamber of a spin coating system and each performs a resist stripping treatment by supplying a resist stripper or a rinsing treatment after stripping by supplying IPA or pure water. As the rinsing chamber 405, a rinsing method of a line system provided with a shower nozzle 408 and a drying device 409 comprising an air blower is illustrated but a rinsing treatment by a spin method is permissible. Further, an IR chamber 413 is a place in which the substrate is preheated by a heating device 412 using a halogen lamp or an infrared ray lamp. Still further, the heating device 412 and a treating unit 407 of the exposure treatment chamber 402 both may be provided together, and be considered to be one treating chamber.

In the exposure treating chamber 402, provided is the treating unit 407, which is an important part according to the present invention, for emitting light within the photosensitive wavelength region of the DNQ photosensitizer on the resist pattern. As for the light within the photosensitive wavelength region of the DNQ photosensitizer, light having a wavelength of from 350 nm to 450 nm is ordinarily required, though depending on types of DNQ photosensitizers. As for a light source which satisfies the above-described wavelength region, an ultra high-pressure mercury lamp which is ordinarily used as a light source for a 1:1 projection aligner utilizing light having a multiple of wavelengths or the equivalent projection exposure apparatus utilizing light having a single wavelength is exemplified as a favorable example and constituted such that it can emit light having a multiple of wavelengths comprising the g-line (436 nm), h-line (405 nm), and i-line (365 nm) which are each spectral light of the ultra high-pressure mercury lamp. In order to perform such irradiation, a constitution comprising an optical filter, an ultra high-pressure mercury lamp as a light source, and an electric power supply line for supplying electric power to the ultra high-pressure mercury lamp is provided. As for the optical filters, an absorption filter and a thin-film interference filter are conceivable whereupon these filters are appropriately laminated to allow light having a multiple of wavelengths comprising the g-line (436 nm), h-line (405 nm), and i-line (365 nm) to be spectrally transmitted. Further, though a treating period of time of light irradiation may not be so severely defined as the exposing period of time in the exposure apparatus, since the treating period of time gives an influence on softening of a shape of the resist pattern, it is necessary to constitute the apparatus such that a light irradiation treatment can be performed for a predetermined period of time. In such apparatus constitution, though not shown, provision of a device, for example, provision of a shutter mechanism, or provision of a mechanism for supplying electric power to the ultra high-pressure mercury lamp only for a predetermined period of time is considered.

In the embodiments according to the present invention, a case in which the exposure treatment chamber and the resist stripping apparatus are combined with each other is illustrated, but as another case, the exposure treatment chamber, and an ashing apparatus or a dry-etching apparatus may also be combined with each other. In other words, such exposure treatment unit as described above may be attached to the ashing apparatus or the dry-etching apparatus of separate multi-chamber system as one of such chambers.

Example

An acrylic resin layer having a thickness of 800 nm was formed on a glass substrate. A titanium nitride (TiN) film, an aluminum (Al:Si (1 wt %)) film, a titanium nitride (TiN) film, and a titanium (Ti) film were laminated in the stated order on the thus-formed acrylic resin layer in thicknesses of 60 nm, 40 nm, 300 nm, and 100 nm, respectively. Then, a diazonaphthoquinone (DNQ)-novolac resin type of positive resist composition was applied on the resultant laminate and subjected to a pre-baking treatment for a predetermined period of time at a treating temperature of about 100° C. to form a resist film having a predetermined thickness. Thereafter, the thus-formed film was subjected to an exposure treatment for a predetermined period of time by using a 1:1 projection aligner utilizing light having a multiple of wavelengths (e.g., g-line, h-line, and i-line) of an ultra high-pressure mercury lamp and, then, subjected to a development treatment for a predetermined period of time by using a developer (2.38%) of tetramethyl ammonium hydroxide (TMAH; chemical formula: $(CH_3)_4NOH$) which is an organic alkaline developer to form a resist pattern having a predetermined size. The thus-formed resist pattern was subjected to a post-baking treatment at 115° C., and then subjected to an exposure treatment. The exposure treatment was performed by emitting light of 70 mW/cm$^2$ by using a metal halide lamp which emits a plurality of bright lines in the wavelength region of from 300 nm to 400 nm. The exposure period of time was varied in the range of from 0 second to 1000 seconds for comparison.

The above-described metal layer of a laminate type was processed by the dry-etching process by using an etching gas which is a mixture of boron trichloride ($BCl_3$) and chlorine (Cl$_2$). Removal of the resist pattern was performed first by an ashing process by using oxygen plasma for 150 seconds, and then, by using a non-aqueous-type resist stripper (trade name: N-300; available from Nagase ChemteX Corporation) for 85 seconds at 80° C.

Figures 9A, 9D:
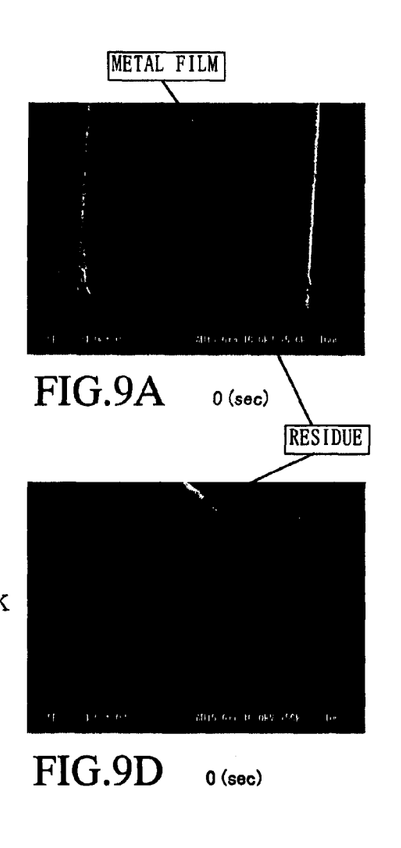
FIGS. 9A to 9F are photographs showing the state after a resist pattern is removed is observed under a scanning electron microscope.
Figure 9B:
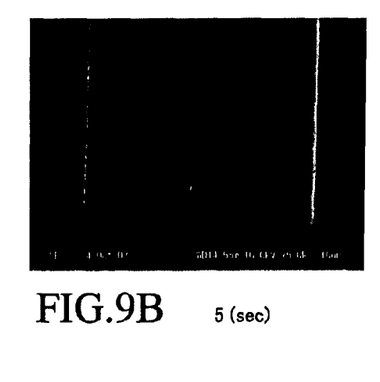
Figure 9C:
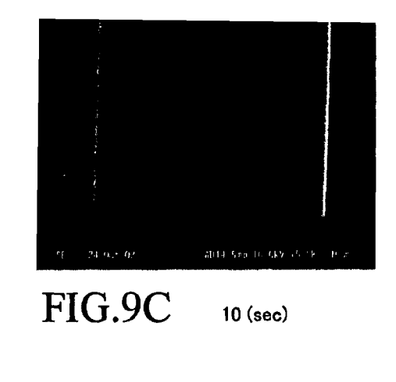
Figure 9E:
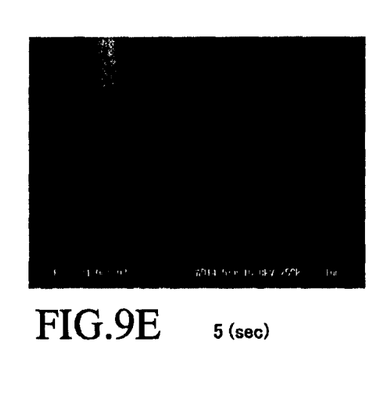
Figure 9F:
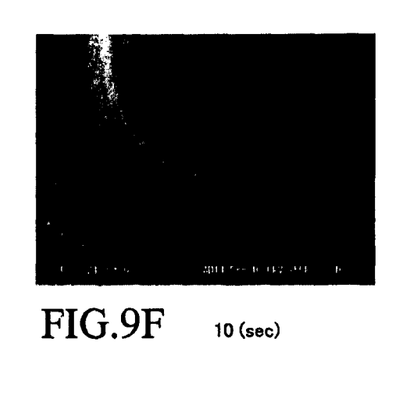

In FIGS. 7A to 7H, given are photographs each showing a result of observation of a state after a resist pattern was subjected to removal treatment by an optical microscope of 500 magnifications. An exposure period of time was varied in the range of from 0 second to 750 seconds. The photograph shows whether or not the resist pattern remains in such variance. As is apparent from the photograph in FIG. 7A, when the exposure period of time was 0 second, it was found that a residue was left. However, as is apparent from FIGS. 7B to 7F, it was observed that, by performing the exposure treatment, the resist pattern was favorably removed. Further, in FIGS. 9A to 9C in each case of ×5 K and ×50 K, shown are photographs of similar samples observed by a scanning electron microscope. These photographs correspond to those in FIGS. 7A to 7C, respectively.

Figure 8A:
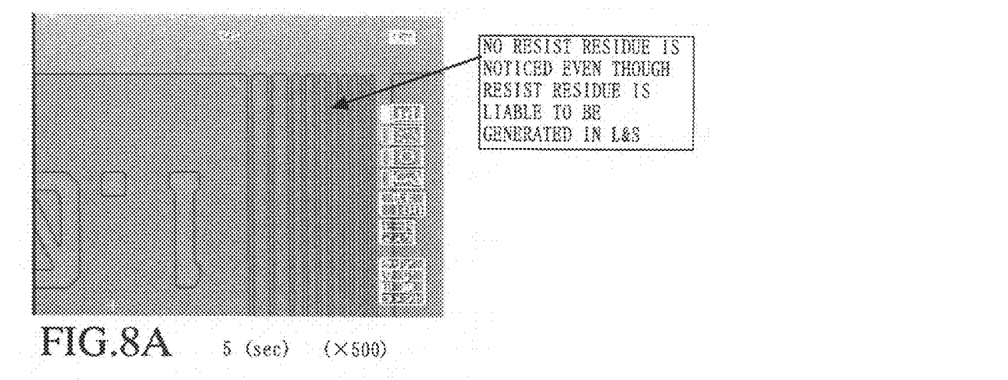
FIGS. 8A to 8C are photographs showing the state after a resist pattern is removed is observed under a light microscope.
Figure 8B:
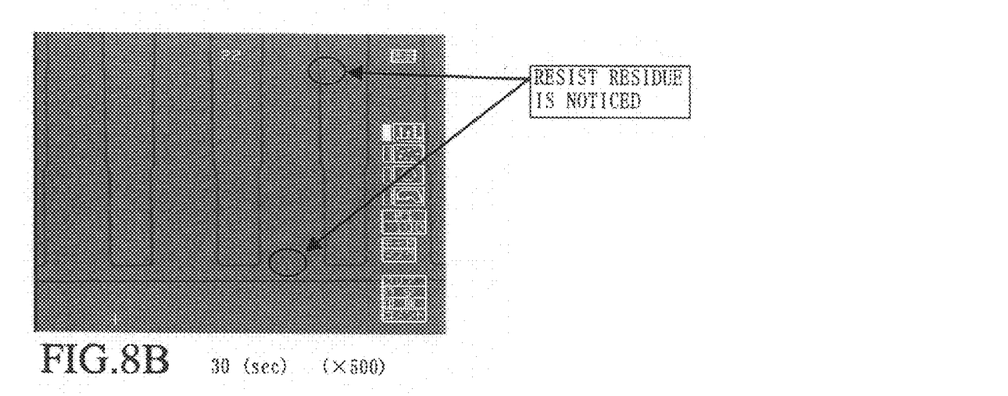
Figure 8C:
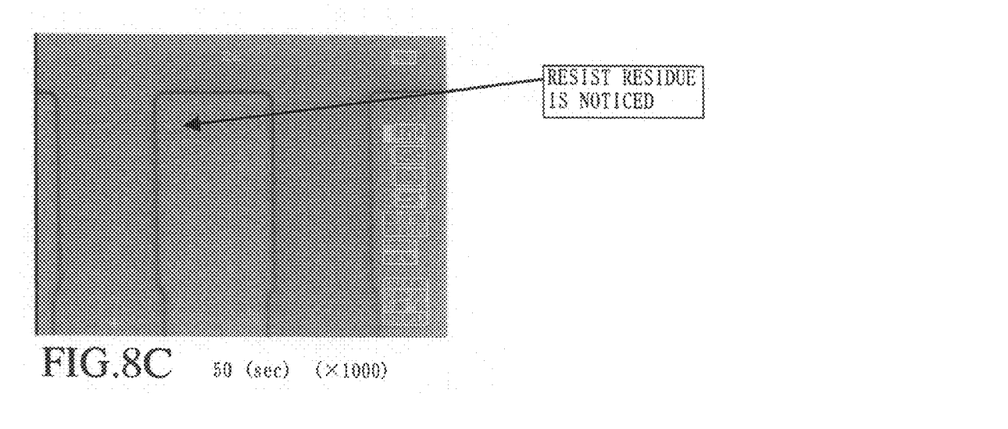

However, as shown in photographs in FIGS. 8A to 8C, when the exposure period of time was 5 seconds, a residue was not left in a space in a fine pattern (see FIG. 8A), while, when the exposure period of time was 30 seconds or more, the residue, though being small, was noticed (see FIGS. 8B and 8C). These results show that, when the exposure period of time was over a given range, a new polymer was produced by a photoreaction, thereby leaving a residue. As seen from such trend shown in FIGS. 7G to 7H, it can be observed that the trend becomes more conspicuous as the exposure period of time becomes longer.

As described above, there is an optimum range in each of the development treatment and the exposure period of time for emitting light within a photosensitive wavelength region of the photosensitizer on the resist pattern after developed whereupon, by an exposure period of time of from 1 second to 30 seconds, and preferably from 5 seconds to 10 seconds, the resist pattern after the dry-etching process was performed was favorably be able to be removed.

According to the present invention, by using the resist stripper, removal of the resist pattern after dry-etching is performed can be facilitated. Namely, according to the present invention, by performing the development treatment and the exposure treatment which emits light within a photosensitive wavelength region of the photosensitizer on the resist pattern after developed, solubility thereof to the resist stripper is advanced to facilitate removal of the resist pattern even after the dry-etching process or the doping treatment is performed. Further, according to the present invention, the resist pattern can similarly be removed even after one conductivity type of an impurity ion is accelerated in an electric field and doped therein.

What is claimed is:

1. A method for removing a resist pattern, comprising:
    forming a metal film over a substrate;
    forming a resist film of a positive resist composition containing a photosensitizer;
    exposing the resist film;
    developing the resist film to form a resist pattern over the metal film by using a developer;
    etching the metal film by using the resist pattern;
    removing the resist pattern by using a resist stripper which dissolves and removes the resist pattern after etching the metal film;
    irradiating a residue of the resist pattern with a light having a photosensitive wavelength region of the photosensitizer to react the photosensitizer in the residue of the resist pattern to the light after removing the resist pattern; and
    after the irradiating the residue of the resist pattern, removing the residue of the resist pattern by using the developer which dissolves and removes the residue of the resist pattern.

2. A method for removing a resist pattern according to claim 1,
    wherein the positive resist composition containing the photosensitizer is a diazonaphthoquinone (DNQ)-novolac resin type, and
    wherein the photosensitizer is diazonaphthoquinone (DNQ).

3. A method for removing a resist pattern according to claim 1,
    wherein the metal film forms an electrode of a thin film transistor.

4. A method for removing a resist pattern according to claim 1, wherein the substrate is selected from the group consisting of a glass, a quartz, a semiconductor, a plastic, a plastic film, a metal, a glass-epoxy resin, and a ceramic.

5. A method for removing a resist pattern according to claim 1, wherein the metal film comprises a material selected from the group consisting of aluminum, titanium, molybdenum, tantalum, and tungsten.

6. A method for removing a resist pattern according to claim 1, wherein the resist stripper has a mixture of 2-aminoethanol and a glycol ether as a composition.

7. A method for removing a resist pattern according to claim 1, wherein the light has a multiple wavelengths within the range of photosensitive wavelength region of the photosensitizer.

8. The method of claim 1, wherein exposing the resist film includes irradiating the resist film with the light having the photosensitive wavelength region of the photo sensitizer.

* * * * *

UNITED STATES PATENT AND TRADEMARK OFFICE
CERTIFICATE OF CORRECTION

| | | |
|---|---|---|
| PATENT NO. | : 7,875,419 B2 | Page 1 of 1 |
| APPLICATION NO. | : 10/694986 | |
| DATED | : January 25, 2011 | |
| INVENTOR(S) | : Masaharu Nagai | |

It is certified that error appears in the above-identified patent and that said Letters Patent is hereby corrected as shown below:

Column 7, line 23, change "cross-lining" to "cross-linking".

Signed and Sealed this
Twentieth Day of September, 2011

David J. Kappos
*Director of the United States Patent and Trademark Office*